US008792528B2

(12) United States Patent
Blick et al.

(10) Patent No.: US 8,792,528 B2
(45) Date of Patent: Jul. 29, 2014

(54) SEMICONDUCTOR MICROTUBE LASERS

(75) Inventors: Robert H. Blick, Madison, WI (US); Luke J. Mawst, Sun Prairie, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 162 days.

(21) Appl. No.: 13/467,217

(22) Filed: May 9, 2012

(65) Prior Publication Data
US 2014/0029634 A1 Jan. 30, 2014

(51) Int. Cl.
*H01S 5/12* (2006.01)
*H01S 5/125* (2006.01)

(52) U.S. Cl.
USPC ............................ 372/50.11; 372/93; 372/102

(58) Field of Classification Search
USPC .......................................... 372/50.11, 93, 102
See application file for complete search history.

(56) References Cited

U.S. PATENT DOCUMENTS

| | | | | |
|---|---|---|---|---|
| 4,742,378 A | * | 5/1988 | Ito et al. .................... | 372/46.01 |
| 5,727,013 A | | 3/1998 | Botez et al. | |
| 6,195,381 B1 | | 2/2001 | Botez et al. | |
| 6,906,848 B2 | | 6/2005 | Aubuchon | |
| 7,485,857 B2 | | 2/2009 | Blick | |
| 7,939,346 B2 | | 5/2011 | Blick et al. | |
| 2011/0163421 A1 | * | 7/2011 | Mi ................................. | 257/618 |

OTHER PUBLICATIONS

Kipp et al., Optical Modes in Semiconductor Microtube Ring Resonators, Physical Review Letters, vol. 96, No. 077403, Feb. 24, 2006, pp. 1-4.

Qin et al., Formation of microtubes from strained SiGe/Si heterostructures, New Journal of Physics, vol. 7, No. 241, Nov. 29, 2005, pp. 1-10.

Shaji et al., Magnetotransport through two dimensional electron gas in a tubular geometry, Applied Physics Letters, vol. 90, No. 042101, Jan. 22, 2007, pp. 1-3.

Mawst et al., High-power, single-mode, Al-free InGaAs(P)/InGaP/GaAs distributed feedback diode lasers, Journal of Crystal Growth, vol. 195, Dec. 30, 1998, pp. 609-616.

Ohtani et al., Uniaxial-strain-induced transition from type-II to type-I band configuration of quantum well microtubes, Physica E, vol. 21, Feb. 8, 2004, pp. 732-736.

Strelow et al., Three dimensionally confined optical modes in quantum-well microtube ring resonators, Physical Review B, vol. 76, No. 045303, Jul. 5, 2007, pp. 1-5.

Kreft et al., Chapter 28 Surface Acoustic Waves and Nano-Electromechanical Systems, *Acoustic Waves—From Microdevices to Helioseismology*, ISBN 978-953-307-572-3, Nov. 2011.

Baek et al., Giant Piezoelectricity on Si for Hyperactive MEMS, Science, vol. 334, Nov. 18, 2011, pp. 958-961.

Meyer et al., Magnetotransport in nonplanar SiGe/Si nanomembranes, IEEE Transactions on Nanotechnology, vol. 6, No. 4, May 2007, pp. 446-450.

(Continued)

*Primary Examiner* — Yuanda Zhang
*Assistant Examiner* — Michael Carter
(74) *Attorney, Agent, or Firm* — Bell & Manning, LLC

(57) ABSTRACT

Disclosed are semiconductor microtube lasers including a semiconductor multilayer heterostructure. The multilayer heterostructure includes a substantially cylindrical optically active structure capable of light emission when under the influence of an applied electromagnetic field and a substantially cylindrical distributed feedback grating structure configured to provide optical feedback for a selected wavelength of light from the optically active region and to produce lasing action from the microtube when under the influence of an applied electromagnetic field.

15 Claims, 5 Drawing Sheets

(56) References Cited

OTHER PUBLICATIONS

Yu et al., Semiconductor Nanomembrane Tubes: Three-Dimensional Confinement for Controlled Neurite Outgrowth, ACS NANO, vol. 5, No. 4, Mar. 2, 2011, pp. 2447-2457.

Bianucci et al., Self-Organized 1.55 μm InAs/InP Quantum Dot Tube Nanoscale Coherent Light Sources, Presented at Conference Winter Topicals (WTM) 2011 IEEE, Jan. 10-12, 2011, pp. 127-128.

Vicknesh et al., Optical microcavities on Si formed by self-assembled InGaAs/GaAs quantum dot microtubes, Applied Physics Letters, vol. 94, No. 081101, Feb. 23, 2009, pp. 1-3.

* cited by examiner

SEMICONDUCTOR MICROTUBE LASERS

REFERENCE TO GOVERNMENT RIGHTS

This invention was made with government support under W911NF-05-1-0262 awarded by ARMY/ARO. The government has certain rights in the invention.

BACKGROUND

Semiconductor microstructures have been fabricated from strained semiconductor membranes. These strained semiconductor membranes can be grown on substrates using standard deposition techniques and subsequently patterned using standard lithographic techniques. The strain creates a curvature in the membrane such that when the membrane is released from the substrate upon which it is grown, the membrane curves and rolls up into various types of microstructures, including microtubes. The techniques referenced above can be used to produce highly regular, highly reproducible arrays of semiconductor microstructures having a variety of shapes and dimensions.

Various uses for semiconductor microtubes have been contemplated, such as freely distributed wireless sensors and drug delivery devices. It has also been shown that certain semiconductor microtubes exhibit optical activity. In particular, photoluminescence measurements of certain semiconductor microtubes have shown that some semiconductor microtubes form optical ring resonators.

However, significant impediments to realizing the potential of optically active semiconductor microtubes include the challenges of providing frequency selective feedback and engineering semiconductor microtubes with sufficient feedback and gain such that the microtube is capable of functioning as a true laser.

SUMMARY

Provided herein are semiconductor microtube lasers, arrays of such lasers and devices incorporating the same.

In one aspect, semiconductor microtube lasers are provided. The semiconductor microtube lasers include a multilayer heterostructure in the form of a microtube. The multilayer heterostructure includes a substantially cylindrical optically active structure comprising at least one semiconductor layer, the optically active structure capable of light emission when under the influence of an applied electromagnetic field; and a substantially cylindrical distributed feedback grating structure comprising periodically alternating elements, wherein adjacent elements of the distributed feedback grating structure have different indices of refraction. The distributed feedback grating structure is positioned and configured to provide optical feedback for a selected wavelength of light from the optically active structure and to produce lasing action from the microtube when under the influence of an applied electromagnetic field.

In another aspect, arrays of semiconductor microtube lasers are provided including a substrate and a plurality of semiconductor microtube lasers disposed on the substrate.

In another aspect, wavelength-tunable devices are provided. The devices include any of the disclosed semiconductor microtube lasers or arrays thereof and are capable of producing wavelength-tunable lasing light from the semiconductor microtube laser(s) included in the devices.

In another aspect, steerable devices are provided. The devices include any of the disclosed semiconductor microtube lasers or arrays thereof and are capable of altering the position of the longitudinal axis of the semiconductor microtube laser(s) with respect to an underlying substrate, thereby altering the direction of lasing light emitted from the steerable devices.

The disclosed semiconductor microtube lasers, arrays and devices will find use in a variety of applications such as telecommunication devices, sources for integration with silicon based electronics (CMOS) for integrated optoelectronics or board to board optical interconnects, as well as in LED displays. Data transfer rates may be enhanced due to the ability to precisely tune the bandwidth of at least some embodiments of the semiconductor microtube lasers and devices. Other embodiments may be used for atmospheric monitoring, analysis of gaseous mixtures, optical fiber data transmission, analog broadband signal transmission, absorption spectroscopy, laser printers and computer mice.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
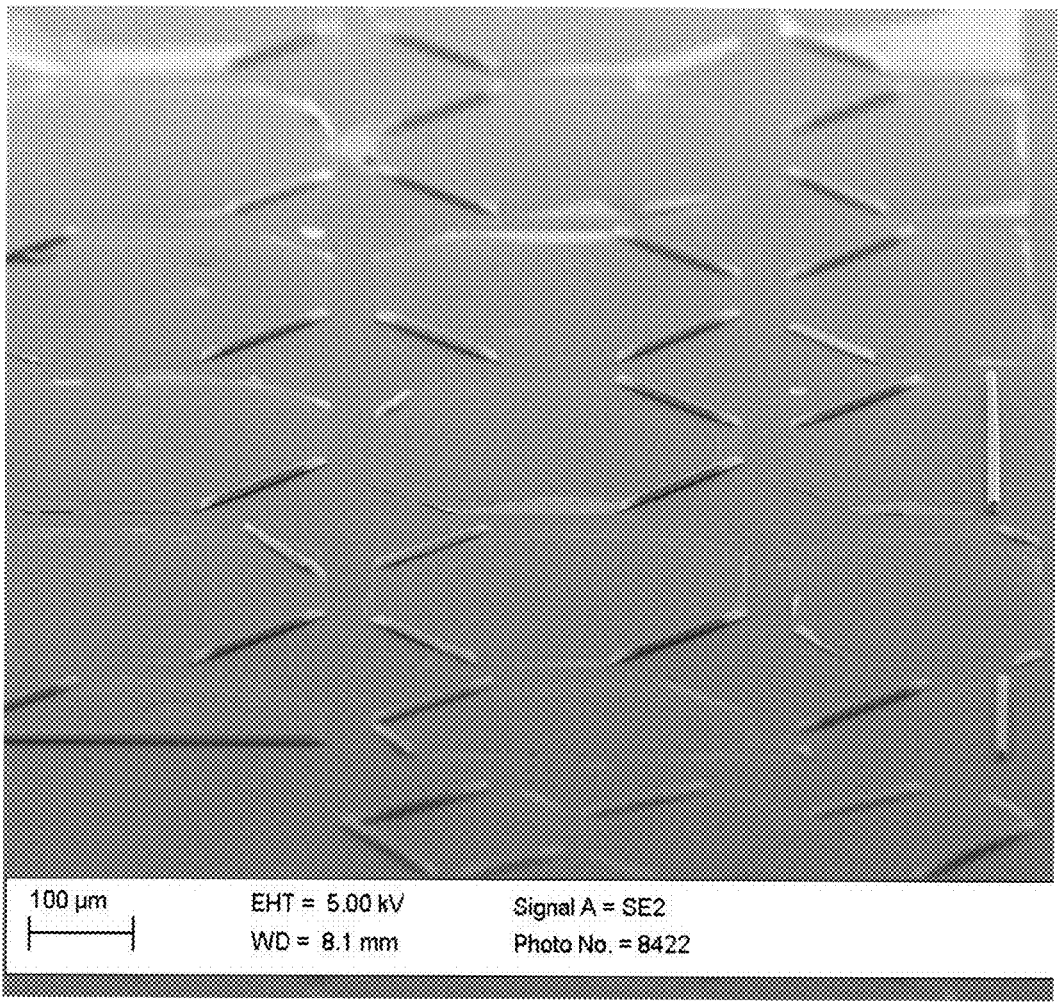
FIG. 1 depicts an array of semiconductor microtubes formed from a strained layer structure according to an illustrative embodiment.

Provided herein are semiconductor microtube lasers, arrays of such lasers and devices incorporating the same.

The semiconductor microtube lasers include a multilayer heterostructure in the form of a microtube. The multilayer heterostructure includes an optically active structure and a distributed feedback grating structure. Each of these components of the multilayer heterostructure as well as their relationship to one another is described in detail below.

The multilayer heterostructure can be fabricated from a planar or substantially planar multilayered epitaxial semiconductor structure grown on a sacrificial substrate. As grown, the multilayered semiconductor substrate includes at least two layers of semiconductor, one of which is grown under strain (e.g., a tensile, elastic or compressive strain) with respect to the other layer due to a lattice mismatch between the two layers. The strain is sufficient to induce a curvature in the multilayer heterostructure to form a microtube from the multilayer heterostructure upon release of the heterostructure from the sacrificial substrate and relaxation or partial relaxation of the strain. The formation of microtubes from strained semiconductor layers has been discussed in U.S. Pat. No.

7,939,346 and in Qin et al., New Journal of Physics, 7, p. 241 (2005), each of which is hereby incorporated by reference in its entirety.

Briefly, by way of illustration only, a multilayered heterostructure in the form of a microtube may be formed as follows. A sacrificial layer may be first deposited onto or grown over a substrate. The various layers forming the optically active layer structure, optical confinement structures, cladding structures and distributed feedback grating structures can then be grown sequentially on the sacrificial layer. At least two of these layers will comprise a strained layered structure (e.g., a strained bilayer) having sufficient strain to induce microtube formation upon the release of the multilayered heterostructure from the substrate. The two or more strained layers may be part of the optically active structure, an optical confinement structure, a cladding structure or a distributed feedback grating structure. In some embodiments, the two or more strained layers will bridge two or more of these structures. In some embodiments strained layers within the as-grown heterostructure may be separated by one or more layers that are not under strain. Epitaxial growth of the layer can be carried out by, for example, metalorganic chemical vapor deposition (MOCVD) or molecular beam epitaxy (MBE). Prior to release from the growth substrate, the multilayered heterostructure may be patterned (e.g., by photolithography or electron beam lithography) into a variety of possible shapes having a variety of possible lateral (i.e., lengths and widths) dimensions. Finally, the strained layer structure may be released by selective etching of the sacrificial layer (e.g., by wet chemical etching or dry plasma etching). As the strained layer structure is released from the substrate, the heterostructure is released, it will curl towards the strained layer with the smaller lattice constant. A variety of geometries may be formed as the strained layer structure is released, including cylindrical geometries such as tubes, coils, helices and similar shapes. For the purposes of this disclosure, these shapes, each of which defines a cylindrical or substantially cylindrical interior bore are considered cylindrical shapes. The particular geometry will depend upon at least the shape and lateral dimensions of the strained layer structure as well as the composition, crystal structure and thicknesses of the semiconductor layers of the strained layer structure. Thus, the geometry of the released strained layer structure may be well controlled upon release of the strain.

A variety of semiconductor materials may be used for the semiconductor layers of the multilayered heterostructure. In some embodiments, the semiconductor layers are formed from group III/V alloys. Exemplary alloys include AlGaAs, GaAs, InGaAs, InAlGaAs and InGaAsP. In such alloys, the relative proportions of certain of the components may vary. By way of illustration only, in the alloy of AlGaAs, the relative proportions of Al and Ga may vary. The at least two layers of strained semiconductor in the multilayered heterostructures need only differ in composition and/or crystal structure from each other such that one layer is under strain with respect to the other layer due to a lattice mismatch between the two layers, the strain sufficient to induce a curvature in the multilayer heterostructure to form a microtube from the multilayer heterostructure upon release of the strain. By way of illustration only, a strained layer structure may include a layer of GaAs disposed on a layer of InGaAs to form a strained GaAs/InGaAs bilayer.

Similarly, the thicknesses of layers of the strained layer structure may vary, provided they are sufficiently thin to allow the built-in strain in the heterostructure to induce microtube formation upon release of the strain. In some embodiments, the thicknesses of the layers are in the range of from about 5 nm to about 2000 nm. This includes embodiments in which the thicknesses are in the range of from about 10 nm to about 1000 nm, from about 10 nm to about 100 nm, or from about 10 nm to about 50 nm.

As will be discussed in greater detail below, known techniques from the semiconductor processing industry may be used to form both the strained layer structures and the other layers of the multilayer heterostructures. Such techniques can be used for the mass production of substantially identical semiconductor microtubes, including arrays of such structures. An array of semiconductor microtubes from strained Si and Ge bilayers is shown in FIG. 1. Methods for the fabrication of such microtubes are described in Yu et al., ACS Nano., vol. 5, no. 4, pp. 2447-2457 (2011).

The semiconductor microtube lasers include a substantially cylindrical optically active structure. As used herein, the term "substantially" is used to modify cylindrical in recognition of the fact that, upon the formation of the microtubes, the opposing edges of the heterostructures from which they are made may not align precisely into a perfect cylindrical shape. Instead, the opposing edges may, for example overlap with one another, or misalign to some degree, such that the resulting structure, though primarily cylindrical in nature is not a perfect cylinder.

The optically active structure includes an active region including at least one semiconductor layer, the active region capable of light emission under the appropriate conditions (e.g., when under the influence of an applied electromagnetic field). An exemplary optically active structure is one which includes one or more layers of semiconductor quantum dots. Another exemplary optically active structure is one which includes one or more layers of semiconductor quantum wells. Yet another exemplary optically active structure is one which includes a quantum cascade structure including an electron injector, an active region adjacent to the electron injector and an electron extractor adjacent to the active region, wherein the electron injector, active region and electron extractor each include a superlattice of semiconductor quantum wells and semiconductor barriers. Thus, depending upon the choice of optically active structure, the disclosed semiconductor microtube lasers can provide both interband semiconductor diode lasers (which emit photons when electrons and holes recombine within the active region) and intersubband semiconductor lasers (which emit photons when electrons within a given energy band relax between the quantized states of the active region).

In addition to the active region, the microtube heterostructure can include and optical confinement structure and/or a cladding structure, each of which can itself include more than one layer of semiconductor material. For example, in some embodiments, the microtube lasers include a substantially cylindrical inner cladding structure and a substantially cylindrical outer cladding structure. In such embodiments, the substantially cylindrical optically active structure is disposed around the substantially cylindrical inner cladding structure and the substantially cylindrical outer cladding structure is disposed around the substantially cylindrical optically active structure. The microtube heterostructures may also optionally include a substantially cylindrical inner optical confinement structure and a substantially cylindrical outer optical confinement structure. In such embodiments, substantially cylindrical inner optical confinement structure can be disposed between the substantially cylindrical optically active structure and the substantially cylindrical inner cladding structure and the substantially cylindrical outer optical confinement structure is disposed between the substantially cylindrical outer cladding structure and the substantially cylindrical optically active structure.

A variety of semiconductor materials may be used for the semiconductor layers of the optically active structure, the cladding structures and the optical confinement structures. In some embodiments, the semiconductor layers are formed from group III/V alloys. Exemplary alloys for semiconductor quantum dots include InAs. Exemplary alloys for semiconductor quantum wells include InGaAs and InGaAsP. Exemplary alloys for the superlattice of quantum cascade structures include quantum well/barriers such as InGaAs/InAlAs and GaAs/AlGaAs. Other alloys and combinations thereof are possible. Similarly, the thicknesses of the semiconductor layers may vary.

The optically active structures can include other layers disposed under, over, or within the active region. By way of illustration only, the optically active structures can include additional barrier layers, current blocking layers, capping layers, metal contact layers, etc. Suitable compositions and thicknesses of such layers are known. It is to be understood that these other layers may be defined as part of the optically active structure itself or may be included as an additional layer within the multilayer heterostructure.

As noted above, the strained layers within the as-grown multilayered heterostructure may be part of one or more of the laser structures. By way of illustration only, a multilayer heterostructure may include a strained layer structure including a layer of GaAs disposed on a layer of InGaAs and an optically active structure including an active region including a layer of InAs quantum dots. The layer of InAs quantum dots may be embedded within the GaAs layer of the strained layer structure. Moreover, one or more layers of the optically active structure may also be identified as one or more layers of the strained layer structure.

Known techniques may be used for forming the layers of the optically active structure (e.g., metalorganic chemical vapor deposition (MOCVD) or molecular beam epitaxy (MBE)). Such techniques are described at least in Mawst et al., J. Crystal Growth 195, p. 609 (1998); Kanskar et al., Elec. Lett. 42, No. 25, p. 1455 (2006); Nesnidal et al., IEEE Photonics Tech. Lett. 10, 507 (1998); Earles et al., APL 73, 2072 (1998); Nesnidal et al., IEEE Photonics Tech. Lett. 8, 182 (1996), each of which is incorporated by reference in its entirety.

The disclosed semiconductor microtube lasers further include a substantially cylindrical distributed feedback grating structure. The distributed feedback grating structure includes periodically alternating elements wherein adjacent elements of the distributed feedback grating structure have different indices of refraction. The position of the distributed feedback grating structure with respect to the active region of the optically active structure and the configuration of the distributed feedback grating structure are such that the distributed feedback grating structure provides optical feedback for a selected wavelength of light from the active region of the optically active structure and produces lasing action from the microtube.

Figure 2:
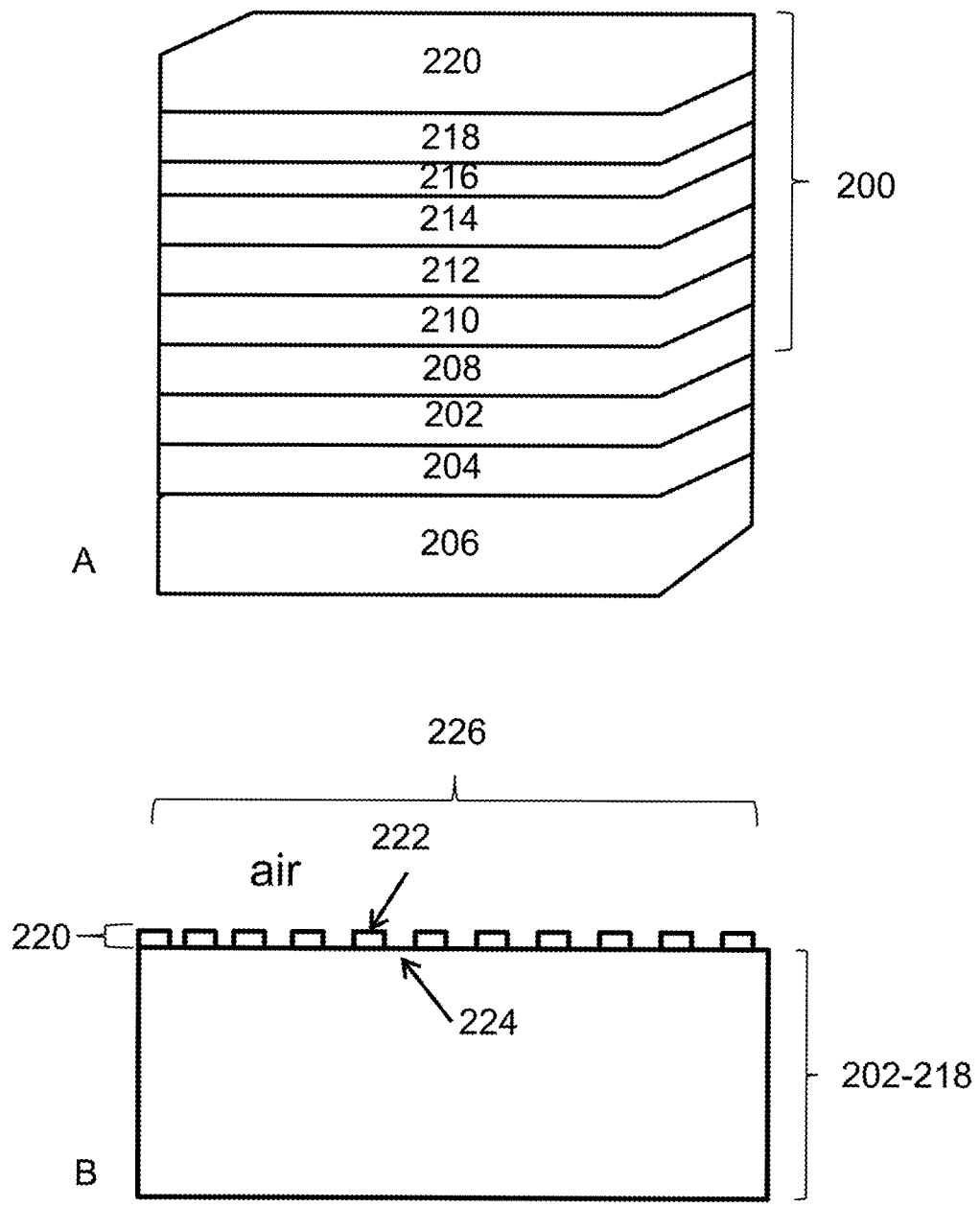
FIG. 2 depicts the layer sequence (A) and a cross-sectional view (B) of a multilayer heterostructure according to an illustrative embodiment.

A variety of shapes and dimensions are possible for the distributed feedback grating structure. The shape may vary as long as the shape provides periodically alternating elements, e.g., alternating peaks and valleys, along a cross-section of the distributed feedback grating structure. An exemplary shape of the grating of a distributed feedback grating structure 220 is shown in FIG. 2B. Other exemplary shapes include a sinusoidal shape, a triangular shape or a sawtooth shape. The distributed feedback grating structure 220 includes adjacent elements 222 and 224. The period Λ of the distributed feedback grating structure (i.e., the combined width of adjacent elements 222 and 224) may be selected to satisfy the second order Bragg condition, that is, $\Lambda = \lambda/n_{eff}$ (or a multiple thereof, i.e., $\Lambda = m\lambda/n_{eff}$, where m is an even number), where $\lambda$ is the wavelength of light emitted from the active region of the optically active structure and $n_{eff}$ is the effective index of refraction in the multilayer heterostructure. A first-order Bragg condition may also be utilized. For the exemplary multilayer heterostructure 200 shown in FIG. 2A (described in detail below), the wavelength of light emitted by the semiconductor quantum well 212 is 0.98 μm, the width of the elements 222 is 30 nm, the second-order grating period Λ is 0.332 μm, and the grating coupling coefficient κ is 0.037 μm$^{-1}$. Other exemplary dimensions of the distributed feedback grating structure that may be adjusted include the relative width of the adjacent elements (e.g., the relative width of elements 222 and 224), the height of the elements 222 and 224, and the length 226 of the grating across a cross-section of the distributed feedback grating structure.

The above-described grating dimensions are selected to provide a coupling coefficient so that κ*L~1. Typically this product is chosen to be <5. The value impacts the laser threshold as well as the efficiency, and can be designed for a specific device structure. The coupling coefficient is dependent on the overlap of the optical field with the grating, as discuss in Strifer, et al. IEEE J. Quantum Electronics, QE-11, pg. 867, November 1975. One advantage of the present microtube lasers is that, since the optical field is confined on both sides by air, there is a large overlap of the optical fields with the distributed feedback grating layer. This makes it simple to fabricate the grating as a surface grating using, for example, a top InGaP layer.

Similarly, the position of the distributed feedback grating structure with respect to the active region of the optically active structure may vary. In some embodiments, the substantially cylindrical distributed feedback grating structure is around the substantially cylindrical optically active structure and any outer optical confinement and cladding structures, such that it is an outer distributed feedback grating structure. In some embodiments, the substantially cylindrical optically active structure and any inner optical confinement and cladding structures are disposed around the substantially cylindrical distributed feedback grating structure, such that it is an inner distributed feedback grating structure. In some embodiments, the distributed feedback grating structure is the outermost substantially cylindrical structure of the multilayer heterostructure. At least certain embodiments in which the distributed feedback grating structure is the uppermost structure have the advantage of not disturbing the strain of the underlying layers of the multilayer heterostructure. In other embodiments, the distributed feedback grating structure is buried within the multilayer heterostructure.

A variety of compositions are possible for the distributed feedback grating structure as long as the composition provides periodically alternating elements wherein adjacent elements of the distributed feedback grating structure have different indices of refraction. In some embodiments, the distributed feedback grating structure includes one or more layers of a semiconductor. As shown in the exemplary embodiment of FIG. 2B, the distributed feedback grating structure 220 includes one layer of semiconductor. The shape of the layer of semiconductor is such that the distributed feedback grating structure includes periodically alternating elements 222 and 224 wherein adjacent elements 222 (InGaP) and 224 (air) have different indices of refraction. In an alternative embodiment, the distributed feedback grating structure includes two layers of semiconductor, wherein the layers of semiconductor have different indices of refraction. By way of illustration only, a layer of InGaP may be grown and patterned to have a shape similar to the distributed feedback grating structure shown in FIG. 2B. Next, a layer of GaAs may be grown over the layer of InGaP such that the distributed feedback grating structure includes periodically alternating elements wherein adjacent elements formed of InGaP and GaAs have different indices of refraction. Exemplary suitable semiconductors include group III/V alloys such as those disclosed herein. In other embodiments, the distributed feedback grating structure includes one or more layers of metal. Exemplary suitable metals include Ni and Au, which can also serve as electrical contacts for the microtube lasers.

Figure 3:
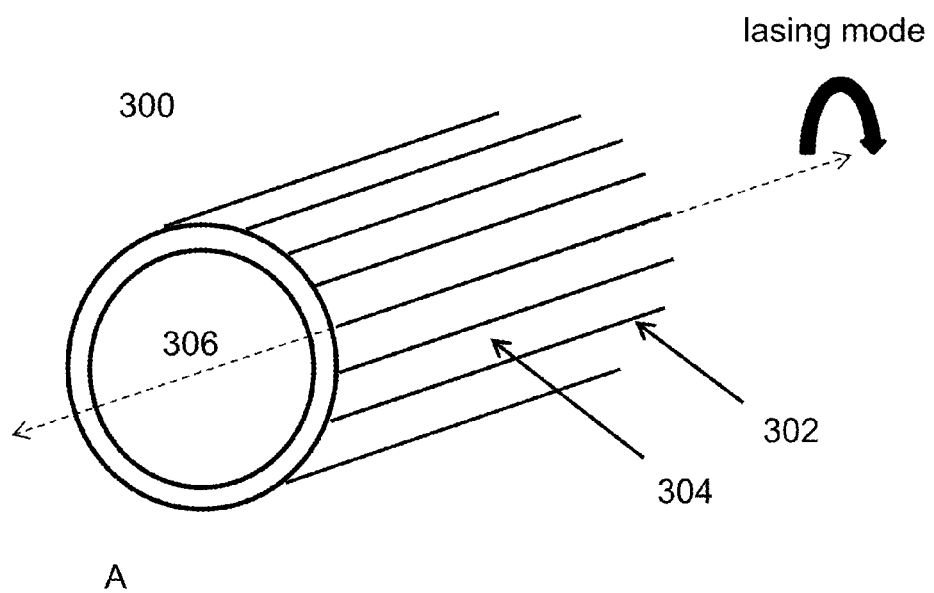
FIG. 3 depicts a semiconductor microtube laser having a distributed feedback grating structure configured to provide a circular laser resonator (A) and a semiconductor microtube laser having a distributed feedback grating structure configured to provide a longitudinal laser resonator (B) according to illustrative embodiments.
Figure 3:
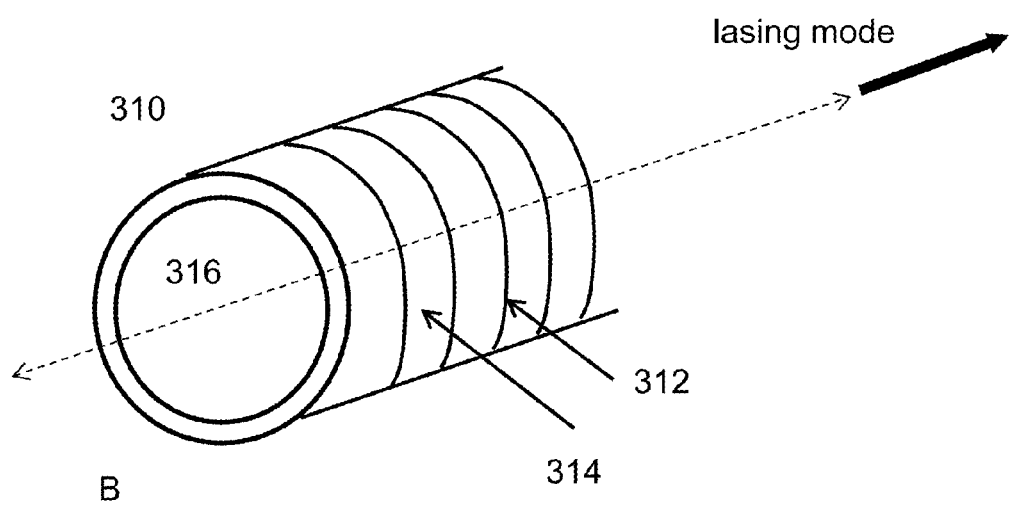

The orientation of the periodic alternating elements of the distributed feedback grating structure with respect to the longitudinal axis of the microtube may also vary. Depending upon the orientation, the lasing mode of the semiconductor microtube laser may vary. In some embodiments, the periodic alternating elements of the distributed feedback grating structure are ridges and channels, each having its longitudinal axes parallel to the longitudinal axis of the microtube, thereby providing a circular distributed feedback for creating a laser resonator. An exemplary such embodiment is shown in FIG. 3A. In the semiconductor laser microtube 300, the distributed feedback grating structure on the outer surface of the microtube includes ridges 302 and channels 304, each having a longitudinal axis parallel to the longitudinal axis 306 of the microtube, thereby providing a circular laser resonator. In some embodiments, the periodic alternating elements of the distributed feedback grating structure are ridges and channels, each substantially encircling the longitudinal axis of the microtube, thereby providing a longitudinal laser resonator. (The term "substantially" is used to modify encircling in recognition of the fact that, upon the formation of the microtubes, the opposing edges of the heterostructures from which they are made may not align precisely into a perfect cylindrical shape. Instead, the opposing edges may, for example overlap with one another, or misalign to some degree, such that the resulting ridges and channels of the distributed feedback grating, though primarily circular in nature are not perfect circles around the longitudinal axis of the microtube.) An exemplary such embodiment is shown in FIG. 3B. In the semiconductor laser microtube 310, the distributed feedback grating structure on the outer surface of the microtube includes ridges 312 and channels 314, each substantially encircling the longitudinal axis 316 of the microtube, thereby providing a longitudinal laser resonator. Other orientations are possible, e.g., orientations between parallel and perpendicular to the longitudinal axis of the microtube.

Growth and patterning techniques for forming distributed feedback structures are known. By way of illustration only, MOCVD can be used to grow the layer(s) of the distributed feedback grating structure in the outermost surface of an upper cladding layer. The layer(s) may be patterned by either electron beam lithography or holographic exposure, followed by wet chemical etching. Additional information about the theory, growth/patterning techniques, exemplary compositions, positions and configurations for the distributed feedback structures may be found in the following references, each of which is hereby incorporated by reference in its entirety: Mawst et al., J. Crystal Growth 195, p. 609 (1998), U.S. Pat. No. 5,727,013 and U.S. Pat. No. 6,195,381.

Figure 4:
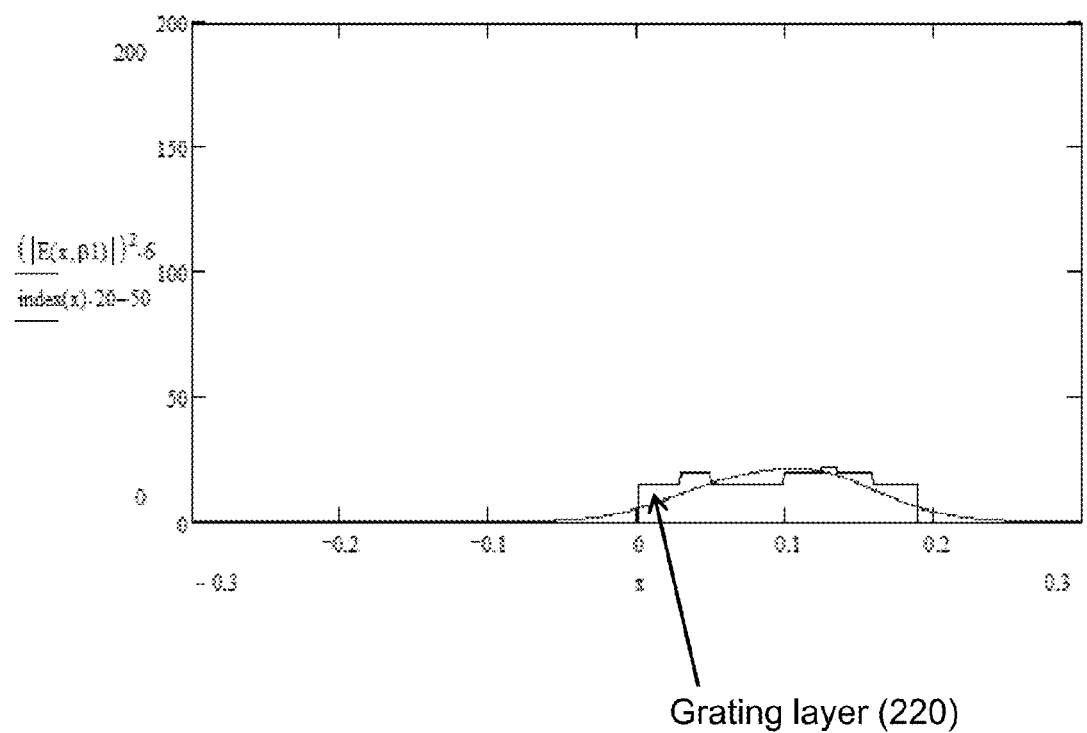
FIG. 4 depicts the calculated optical field for the multilayer heterostructure of FIG. 2.

An exemplary multilayer heterostructure 200 is shown in FIG. 2A. The multilayer heterostructure 200 is formed over a sacrificial layer 202 (e.g., 100 nm AlAs), which is disposed on a buffer layer 204 (e.g., undoped GaAs), which is in turn disposed on a host substrate 206 (e.g., n-GaAs). The multilayer heterostructure includes the following layers from bottom to top: first inner cladding layer 208 (e.g., 30 nm $Al_{0.4}Ga_{0.6}As$), second inner cladding layer 210 (e.g., 25 nm GaAs), active region layer 212 (e.g., 10 nm $In_{0.2}Ga_{0.8}As$), second outer cladding layer 214 (e.g., 25 nm GaAs), second outer cladding layer 216 (e.g., 50 nm $Al_{0.4}Ga_{0.6}As$), a capping layer 218 (e.g., 20 nm GaAs), and distributed feedback grating layer 220 (e.g., 30 nm InGaP). Together, these layers provide the multilayer heterostructure 200 with an optically active structure including an active region layer 212 and a distributed feedback grating structure (220, once the layer is patterned as shown in FIG. 2B). MOCVD may be used to form the multilayer heterostructure 200. Electron beam lithography or holographic exposure, followed by wet chemical etching may be used to form the distributed feedback grating structure 220 as shown in FIG. 2B, which illustrates a cross-sectional view of the structure of FIG. 2A. Once patterned, the distributed feedback grating structure 220 includes periodically alternating elements 222 (30 nm wide InGaP) and 224 (30 nm wide air), which differ in indices of refraction. The second order grating period A of the distributed feedback grating structure 220 is 0.332 μm and the calculated grating coupling coefficient k is 0.037 $\mu m^{-1}$. The wavelength of the light emitted from the quantum well active region 212 is 0.98 μm. The calculated optical field of the multilayer structure 200 is shown in FIG. 4.

After the layers of the multilayer heterostructure are grown, the multilayer heterostructure can be patterned into various shapes and lateral dimensions using techniques similar to those described above in reference to the formation of microtubes from strained semiconductor layers. See also, U.S. Pat. No. 7,939,346 and Qin et al., New Journal of Physics, 7, p. 241 (2005). Briefly, the multilayer heterostructures can be patterned into virtually any two-dimensional shape (e.g., circles, squares, rectangles, etc.) using such techniques as photolithography or electron beam lithography, followed by etching away the unwanted portions of the growth substrate, including one or more sacrificial layers. The lateral dimensions are practically only limited by the substrate size and the patterning techniques used. Suitable exemplary lateral dimensions include multilayer heterostructures having a largest lateral dimension that is no greater than about 2000 μm, no greater than about 1000 μm, no greater than about 200 μm, no greater than about 100 μm, no greater than about 1 μm, or no greater than about 100 nm. Suitable exemplary lateral dimensions also include multilayer heterostructures having a largest lateral dimension in the range from about 100 nm to about 100 μm or from 1 μm to about 100 μm.

After the multilayer heterostructure has been patterned to define its lateral dimensions, the underlying sacrificial layer may be selectively etched to release the multilayer heterostructure using techniques similar to those described above in reference to the formation of microtubes from strained semiconductor layers. See also, U.S. Pat. No. 7,939,346 and Qin et al., New Journal of Physics, 7, p. 241 (2005). Briefly, wet chemical etching techniques (e.g., using hydrofluoric acid) may be used to selectively etch away the underlying sacrificial layer. The sacrificial layer may be partially or completely removed in order to release the heterostructure. As the multilayer heterostructure is released, the multilayer heterostructure may curl upward or downward in response to a differential stress gradient formed across the heterostructure, due at least in part to the strain inherent in the strained layer structure. The degree of curling and the ultimate geometry of the multilayer heterostructure will depend upon at least the shape and lateral dimensions of the multilayer heterostructure as well as the composition, crystal structure and thicknesses of the semiconductor layers of the strained layer structure.

The precise geometries and dimensions of the microtube formed from the disclosed multilayer heterostructures may vary, depending upon the factors described above. By "microtube" it is meant that the structure forms a shape that defines a cylindrical or substantially cylindrical interior bore, although the bore may not be completely enclosed along its entire length. For example the microtube can form when the top surface and the bottom surface of the multilayer heterostructure or the opposite edges of the multilayer heterostructure have contacted each other to create a contact area that extends at least partially or substantially down the length of the cylinder. Such microtubes are shown in FIG. 1. In some embodiments, the length of the microtube is in the range from 500 nm to 1000 μm. In some embodiments, the outer diameter of the microtube is in the range from 100 nm to 50 μm. In some embodiments, the inner diameter of the microtube is in the range from 20 nm to 49 μm.

The multilayer heterostructure may include other layers that may not necessarily be defined as part of the optically active structure, cladding or confinement structures or the distributed feedback grating structure as described above. By way of example only, the multilayer heterostructure may include layers for improving the adhesion between certain layers, to impart conducting or insulating properties to one or more surfaces of the multilayer heterostructure, to provide charge carriers for inducing light emission/lasing under the influence of an electromagnetic field, or to protect the multilayer heterostructure from damage. Conductive layers may be used to provide contacts to voltage sources for applying an electric field across the multilayer heterostructure in order to achieve light emission/lasing. Suitable materials and thicknesses of such layers are known. Techniques for forming such layers have been described above. The position of these layers may vary within the multilayer heterostructure.

The compositions of the sacrificial layer and substrates upon which the multilayer heterostructures are formed may vary. Regarding the sacrificial layer, a variety of materials are possible provided the sacrificial layer can be preferentially removed (e.g., etched) relative to the other materials of the multilayer heterostructures. An exemplary suitable sacrificial layer is AlAs. Regarding the substrates, exemplary suitable substrates include GaAs or InP. Similarly, the thicknesses of the sacrificial layer and substrates may vary.

Any of the layers of the multilayer heterostructure or the sacrificial layer and substrate upon which the multilayer heterostructure is formed may be undoped or doped. In the case of doped layers, the doping may be uniform or non-uniform across the thickness of the layer.

The semiconductor microtube lasers may be characterized by the wavelength of lasing light emitted under the appropriate conditions (e.g., under the influence of an applied electromagnetic field). The wavelength of lasing light may depend, at least in part, on the particular choice of optically active structure and distributed feedback grating structure as well as the dimensions of the semiconductor microtube laser, e.g., the inner diameter and the length of the microtube. In some embodiments, the semiconductor microtube laser is characterized by an ability to emit lasing light at a wavelength in the range of 1 μm to 5 μm.

Also provided herein are arrays of the disclosed semiconductor microtube lasers. The arrays include a plurality of any of the disclosed semiconductor microtube lasers disposed on a substrate. The arrays include at least four semiconductor microtube lasers, but can include a higher number of semiconductor microtube lasers, e.g., $10^6$-$10^{10}$ semiconductor microtube lasers. Other arrays may include from about $10^2$ to about $10^6$ or from about $10^3$ to $10^5$ semiconductor microtube lasers. The substrate on which the semiconductor microtube lasers are disposed may be the same substrate used to form the semiconductor microtube lasers. However, after the semiconductor microtube lasers are formed, they may be collected from these growth substrates and transferred to other substrates. As noted above, the semiconductor processing techniques used to form the semiconductor microtube lasers allow for the mass production of substantially identical semiconductor microtube lasers. However, in some embodiments, the arrays may include semiconductor microtube lasers which differ from one another in one or more ways, e.g., composition, dimensions, wavelengths of lasing light, etc.

The semiconductor microtube lasers or arrays thereof may include other components, e.g., components for achieving light emission from the active region and lasing action from the microtube. By way of illustration only, such a component may be a voltage source electrically coupled to the microtube lasers. Voltage sources and techniques for coupling such voltage sources to the semiconductor microtube lasers or arrays thereof are known.

In another aspect, provided herein are wavelength-tunable devices including any of the disclosed semiconductor microtube lasers. The wavelength-tunable devices are capable of producing wavelength-tunable lasing light from the semiconductor microtube laser(s) included in the devices. As noted above, the wavelength of light emitted from the active region of the disclosed semiconductor microtube lasers depends, at least in part, on a diameter of the lasing cavity, i.e., a diameter of the microtube. By changing a diameter of microtube, the wavelength of the lasing light may be tuned. As further described below, a variety of wavelength-tunable devices are possible.

One embodiment of a wavelength-tunable device makes use of capacitive coupling to generate a change in the value of a diameter of the semiconductor microtube laser. In this embodiment, the wavelength-tunable device includes a conductive substrate, an insulating layer disposed on the conductive substrate and one or more semiconductor microtube lasers disposed on the insulating layer, wherein a diameter of the semiconductor microtube laser undergoes a change in value when a voltage is applied across the semiconductor microtube laser and the conductive substrate. The applied electromagnetic field leads to a change in lattice spacing of at least certain of the layers of the multilayer heterostructure forming the semiconductor microtube laser, thereby causing the microtube to expand or contract. The change in a diameter of the laser cavity as a result of this expansion or contraction corresponds to a change in the wavelength of lasing light emitted from the semiconductor microtube laser. In some embodiments, the wavelength-tunable device includes a voltage source coupled to the conductive substrate and the semiconductor microtube laser.

Materials for the conductive substrate and the insulating layer, voltage sources and techniques for coupling the voltage sources to the conductive substrate and the semiconductor microtube laser are known. An exemplary conductive substrate is a doped GaAs substrate. By "insulating layer" it is meant a layer which includes an electrically insulating material. An exemplary insulating layer is an undoped GaAs buffer layer. Any of the disclosed semiconductor microtube lasers may be used in the wavelength-tunable devices. The semiconductor microtube lasers may form an array within the wavelength-tunable device as described above.

Another embodiment of a wavelength-tunable device makes use of piezoelectric coupling to generate a change in the value of a diameter of the semiconductor microtube laser. This concept is illustrated, for example, in Baek et al., *Science*, 334, 958 (2011). In this embodiment, the wavelength-tunable device includes a substrate, a surface acoustic wave (SAW) generator disposed on the substrate and one or more semiconductor microtube lasers disposed on the substrate, wherein a diameter of the semiconductor microtube laser undergoes a change in value when a voltage is applied to the SAW generator. Alloys of group III/V semiconductors, which are used to form the layers of the multilayer heterostructures of at least some of the disclosed semiconductor microtube lasers, are piezoelectric. The application of voltage to the SAW generator creates an electric field distribution in the piezoelectric layers of the semiconductor microtube lasers. This field distribution, in turn, causes a mechanical deformation of the piezoelectric layers through the inverse piezoelectric effect, causing a SAW to propagate through the piezoelectric layers. The change in a diameter of the laser cavity as a result of this deformation corresponds to a change in the wavelength of lasing light emitted from the semiconductor microtube laser. In some embodiments, the wavelength-tunable device includes a voltage source coupled to the SAW generator. In some embodiments, the voltage source is a DC voltage source. Such a voltage source is capable of deforming the shape of the semiconductor microtube laser through squeezing or compression, resulting in a change in a diameter of the laser cavity. In some embodiments, the voltage source is an AC voltage source. Such a voltage source is capable of deforming the shape of the semiconductor microtube laser by inducing the formation of a standing wave along a diameter of the microtube, resulting in a change in a diameter of the laser cavity. In some embodiments, the voltage source is an AC voltage source having a frequency in the range of from about 5 MHz to about 5 GHz.

Materials for the substrate, SAW generators, voltage sources and techniques for forming SAW generators and coupling the voltage sources to the SAW generators are known. The substrate comprises a piezoelectric material. An exemplary substrate is GaAs. Other suitable piezoelectric substrates include those typically used with SAW devices, including quartz and LiNbO. Various interdigitated transducers may be used for the SAW generators. Additional information regarding the theory, exemplary SAW generators and coupling to nanoelectromechanical systems may be found at least in Kreft et al., Surface Acoustic Waves and NanoElectromechanical Systems, Chapter in *Acoustic Waves—From Microdevices to Helioseismology*, Marco G. Beghi ed., November 2011, which is hereby incorporated by reference in its entirety.

The tunable range of the wavelength-tunable devices may vary (i.e., the range of wavelengths over which the device may be tuned). In some embodiments, the tunable range is 40 Δ nm.

In another aspect, provided herein are steerable devices including any of the disclosed semiconductor microtube lasers. The steerable devices are capable of altering the position of the longitudinal axis of the semiconductor microtube laser(s) with respect to an underlying substrate, thereby altering the direction of lasing light emitted from the steerable devices. As noted above, the disclosed semiconductor microtube lasers are configured to emit lasing light from the microtube. By altering the position of the longitudinal axis of the semiconductor microtube laser(s) with respect to an underlying substrate, devices capable of emitting lasing light in a variety of directions are possible. At least certain embodiments of the steerable devices exhibit advantages over vertical cavity surface emitting lasers which are restricted to laser emission in a single direction, perpendicular to the layers forming the lasers.

In one embodiment, the steerable device includes a substrate and one or more semiconductor microtube lasers attached to the substrate surface. The microtube lasers can be attached to the substrate surface via two anchoring points on one end of the microtube. Advantageously, these anchoring points can also provide access for two current terminals. These anchoring points are formed in such a way that the internal strain within the attaching (clamping) region can raise the opposite end the microtube into a position perpendicular to the substrate surface. Balancing the strain at the two clamping points allows for the positioning of the longitudinal axis of the microtube normal to the substrate's surface. This can be achieved independently for each of the microtubes in an array of microtubes. In this configuration, the lasing microtubes can be positioned to emit radiation vertically from the substrate. The directionality of radiation emission can be changed via the application of biasing voltages on laterally distributed electrodes. This voltage couples capacitively to the tubes, so that the resulting force exerts a precisely controlled torque. The embedded strain balances the electromotive force and allows the tube to swing back to its equilibrium state. Such steerable devices are capable of providing lasing light in any direction parallel to the substrate surface.

Figure 5:
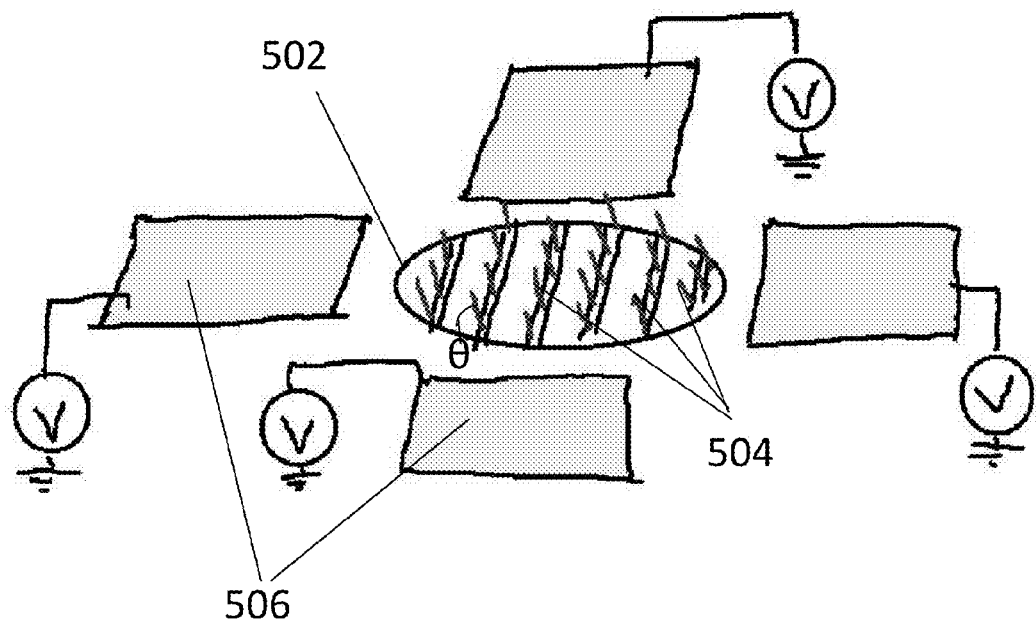
FIG. 5 depicts a steerable device according to an illustrative embodiment.

In another embodiment (shown in FIG. 5), the steerable device includes a substrate 502, one or more freestanding semiconductor microtube lasers 504 attached to the substrate surface such that the longitudinal axes of the freestanding semiconductor microtube lasers forms an angle θ with respect to the substrate surface, and one or more electrodes 506 coupled to the freestanding semiconductor microtube laser, wherein the angle θ undergoes a change in value when a voltage is applied to the electrode. By "freestanding" it is meant that one end of the semiconductor microtube laser is attached to the substrate while the other end is unattached to the substrate. The freestanding semiconductor microtube lasers may also be unsupported along their lengths. Depending upon the number of electrodes and their configuration, such steerable devices are capable of providing lasing light in any direction within the hemisphere above the substrate surface. In some embodiments, the steerable device includes four electrodes and is capable of providing lasing light in any direction within the hemisphere above the substrate surface.

In other embodiments, the microtube lasers are rendered steerable mounting the lasers to an actuator, such as a magnetic or electrostatic actuator, of the type that have been used to tilt mirrors in a micromirror array. Examples of such an actuator available from Lemoptix (Lemoptix MEMS Scanning Micromirror Technology) and from Sercalo. Alternatively, the microtube lasers can be mounted to a mechanical actuator, such as those described in U.S. Pat. No. 6,906,848, the entire disclosure of which is incorporated herein by reference.

Any of the disclosed semiconductor microtube lasers may be used in the wavelength-tunable or steerable devices. The semiconductor microtube lasers may form an array within such devices as described above.

The word "illustrative" or "exemplary" is used herein to mean serving as an example, instance, or illustration. Any aspect or design described herein as "illustrative" or "exemplary" is not necessarily to be construed as preferred or advantageous over other aspects or designs. Further, for the purposes of this disclosure and unless otherwise specified, "a" or "an" means "one or more". Still further, the use of "and" or "or" is intended to include "and/or" unless specifically indicated otherwise.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

The foregoing description of illustrative embodiments of the invention have been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A semiconductor microtube laser comprising a multilayer heterostructure in the form of a microtube, the multilayer heterostructure comprising:
   a substantially cylindrical optically active structure comprising an active region comprising at least one semiconductor layer, the active region capable of light emission when under the influence of an applied electromagnetic field; and
   a substantially cylindrical distributed feedback grating structure comprising periodically alternating elements wherein adjacent elements of the distributed feedback grating structure have different indices of refraction, and further wherein the distributed feedback grating structure is positioned with respect to the active region and is configured to provide optical feedback for a selected wavelength of light from the active region and to produce lasing action from the microtube when under the influence of an applied electromagnetic field.

2. The semiconductor microtube laser of claim 1, further comprising:
   a substantially cylindrical inner cladding structure comprising at least one semiconductor layer, wherein the substantially cylindrical optically active structure is disposed around the substantially cylindrical inner cladding structure; and
   a substantially cylindrical outer cladding structure comprising at least one semiconductor layer, wherein the substantially cylindrical outer cladding structure is disposed around the substantially cylindrical optically active structure.

3. The semiconductor microtube laser of claim 2, wherein the distributed feedback grating structure is disposed around the outer cladding structure.

4. The semiconductor microtube laser of claim 3, wherein the inner cladding structure, the optically active structure, the outer cladding structure and the distributed feedback structure provide a substantially cylindrical quantum cascade laser structure.

5. The semiconductor microtube laser of claim 2, wherein the semiconductor layers of the inner cladding structure, the optically active structure and the outer cladding structure are formed from group III/V alloys.

6. The semiconductor microtube laser of claim 5, wherein the semiconductor layers of the inner cladding structure, the optically active structure and the outer cladding structure comprise layers of GaAs, AlGaAs, InGaAs, or combinations thereof.

7. The semiconductor microtube laser of claim 6, wherein the distributed feedback grating structure comprises a layer of InGaP.

8. The semiconductor microtube laser of claim 1, wherein the periodic alternating elements are ridges and channels each having their longitudinal axes parallel to the longitudinal axis of the microtube, such that the microtube laser is capable of providing a circular laser resonator.

9. The semiconductor microtube laser of claim 1, wherein the periodic alternating elements are ridges and channels each substantially encircling the longitudinal axis of the microtube, such that the microtube laser is capable of providing a longitudinal laser resonator.

10. The semiconductor microtube laser of claim 1, wherein the length of the microtube is no greater than about 1000 μm, the outer diameter of the microtube is no greater than about 50 μm, and the inner diameter of the microtube is at least about 2 nm.

11. The semiconductor microtube laser of claim 1, wherein the optically active structure comprises a layer of InGaAs, the inner and outer cladding layers each comprise a layer of GaAs and the distributed feedback grating structure comprises a layer of InGaP, and further wherein the microtube laser is configured to lase at an emission wavelength of about 0.98 μm with a second order grating period of about 0.3 μm.

12. An array of semiconductor microtube lasers, the array comprising:
   a substrate; and
   a plurality of semiconductor microtube lasers disposed on the substrate, the semiconductor microtube lasers each comprising a multilayer heterostructure in the form of a microtube, the multilayer heterostructure comprising:
   a substantially cylindrical optically active structure comprising an active region comprising at least one semiconductor layer, the active region capable of light emission when under the influence of an applied electromagnetic field; and
   a substantially cylindrical distributed feedback grating structure comprising periodically alternating elements wherein adjacent elements of the distributed feedback grating structure have different indices of refraction, and further wherein the distributed feedback grating structure is positioned with respect to the active region and is configured to provide optical feedback for a selected wavelength of light from the active region and to produce lasing action from the microtube when under the influence of an applied electromagnetic field.

13. A wavelength-tunable device comprising the array of claim 12 and an insulating layer between the substrate and the plurality of semiconductor microtube lasers, wherein the substrate is a conductive substrate and further wherein a diameter of one or more of the semiconductor microtube lasers is configured to undergo a change in value when a voltage is applied across the one or more semiconductor microtube lasers and the conductive substrate.

14. A wavelength-tunable device comprising the array of claim 12 and a surface acoustic wave (SAW) generator disposed on the substrate, wherein a diameter of one or more of the semiconductor microtube lasers is configured to undergo a change in value when a voltage is applied to the SAW generator.

15. A steerable device, the device comprising the array of claim 12 and one or more electrodes coupled to the plurality of semiconductor microtube lasers, wherein one or more of the semiconductor microtube lasers are freestanding such that one end of the semiconductor microtube laser is attached to the substrate surface and the longitudinal axis of the semiconductor microtube laser forms an angle $\theta$ with respect to the substrate surface, and further wherein the angle $\theta$ undergoes a change in value when a voltage is applied to the electrode.

* * * * *

UNITED STATES PATENT AND TRADEMARK OFFICE
CERTIFICATE OF CORRECTION

| | | |
|---|---|---|
| PATENT NO. | : 8,792,528 B2 | Page 1 of 1 |
| APPLICATION NO. | : 13/467217 | |
| DATED | : July 29, 2014 | |
| INVENTOR(S) | : Robert H. Blick et al. | |

It is certified that error appears in the above-identified patent and that said Letters Patent is hereby corrected as shown below:

IN THE SPECIFICATION

Col. 5, Line 67

Delete "The period A" and replace with --The period $\Lambda$--

Col. 8, Line 21

Delete "grating period A" and replace with --grating period $\Lambda$--

Signed and Sealed this
Tenth Day of March, 2015

Michelle K. Lee
*Deputy Director of the United States Patent and Trademark Office*